(12) United States Patent
Suzuki

(10) Patent No.: US 11,917,765 B2
(45) Date of Patent: Feb. 27, 2024

(54) DEVICE FOR ESTIMATING CAUSE OF MOUNTING ERROR, AND METHOD FOR ESTIMATING CAUSE OF MOUNTING ERROR

(71) Applicant: FUJI CORPORATION, Chiryu (JP)

(72) Inventor: Ikuo Suzuki, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 258 days.

(21) Appl. No.: 17/435,490

(22) PCT Filed: Mar. 19, 2019

(86) PCT No.: PCT/JP2019/011578
§ 371 (c)(1),
(2) Date: Sep. 1, 2021

(87) PCT Pub. No.: WO2020/188774
PCT Pub. Date: Sep. 24, 2020

(65) Prior Publication Data
US 2022/0142027 A1 May 5, 2022

(51) Int. Cl.
*H05K 13/08* (2006.01)
*H05K 13/04* (2006.01)

(52) U.S. Cl.
CPC .......... *H05K 13/0812* (2018.08); *H05K 13/04* (2013.01); *H05K 13/0815* (2018.08); *H05K 13/0882* (2018.08)

(58) Field of Classification Search
CPC ........... G05B 2219/31356; G05B 2219/45029; G05B 23/0275; G05B 19/406; G05B 19/4184; H05K 13/0882; H05K 13/083; H05K 13/0812; H05K 13/04; H05K 13/0815

See application file for complete search history.

(56) References Cited

FOREIGN PATENT DOCUMENTS

| | | |
|---|---|---|
| CN | 102143681 A | 8/2011 |
| EP | 2 355 646 A2 | 8/2011 |
| JP | 2010-238689 A | 10/2010 |

OTHER PUBLICATIONS

International Search Report dated Jun. 11, 2019 in PCT/JP2019/011578 filed on Mar. 19, 2019, 2 pages.

*Primary Examiner* — Moshe Wilensky
(74) *Attorney, Agent, or Firm* — Oblon, McClelland, Maier & Neustadt, L.L.P.

(57) ABSTRACT

A device for estimating a cause of a mounting error includes a first determination section configured to perform a process of determining whether the error occurrence status is biased under a condition that an individual as the first factor is specified according to a difference in the second factor, on each of multiple individuals as the first factor, a second determination section configured to perform a process of determining whether the error occurrence status is biased under a condition that an individual as the second factor is specified according to a difference in the first factor, on each of multiple individuals as the second factor, and a cause estimation section configured to estimate a causative individual causing the mounting error based on determination results in the first determination section and the second determination section.

12 Claims, 4 Drawing Sheets

| FEEDER \ SUCTION NOZZLE | NZ1 | NZ2 | NZ3 | NZ4 | NZ5 |
|---|---|---|---|---|---|
| FD1 | 1/200 | 6/200 | 1/200 | 2/100 | 0/100 |
| FD2 | 0/100 | 0/0 | 2/100 | 0/0 | 0/0 |
| FD3 | 1/100 | 4/100 | 1/100 | 0/100 | 0/100 |
| FD4 | 2/300 | 5/100 | 2/100 | 1/100 | 0/0 |
| FD5 | 1/200 | 7/100 | 3/200 | 0/100 | 0/100 |

Fig. 6

| SUCTION NOZZLE / ARRANGEMENT DATA | NZ1 | NZ2 | NZ4 |
|---|---|---|---|
| SL1 | 0/100 | 5/100 | 1/200 |
| SL3 | 4/100 | 6/100 | 8/200 |
| SL5 | 1/100 | 9/200 | 2/100 |

DEVICE FOR ESTIMATING CAUSE OF MOUNTING ERROR, AND METHOD FOR ESTIMATING CAUSE OF MOUNTING ERROR

TECHNICAL FIELD

The present specification relates to a device for estimating a cause of a mounting error that occurs in mounting work of a component mounter, and a method for estimating the cause.

BACKGROUND ART

A technique of mass-producing board products by performing board work on a board on which printed wiring is performed has become widespread. A typical example of a board work machine performing the board work is a component mounter that performs component mounting work. Generally, a component mounter includes a component supply device configured to supply a component and a component mounting device configured to pick up a component from the component supply device and to mount the component on a board. Many component mounters discard a component when the mounting work fails and performs the mounting work again.

In the conventional art, the number of mounting errors of mounting work having failed is aggregated in a ranking form for each type of device, and is provided to a manager or an operator. In a case where an occurrence frequency of mounting errors is high, that is, an error occurrence status is not favorable, a causative individual is specified based on the ranking, and improvement procedures such as replacement and maintenance of a device are performed. One example of a technique relating to specifying of an individual causing a mounting error is disclosed in Patent Literature 1.

A computing device disclosed in Patent Literature 1 includes a storage section and a control section. The storage section stores device operation information for specifying the number of operations of first component devices and second component devices handling components and abnormality history information for specifying the number of abnormalities. The control section performs a process of calculating a first abnormality occurrence ratio for each first component device, a process of calculating a second abnormality occurrence ratio for each second component device, a process of specifying a first component device having a high first abnormality occurrence ratio, a process of specifying a second component device having a high second abnormality occurrence ratio, and a process of estimating one of the specified first component device and the second component device as a causative individual. In an embodiment, a suction nozzle and a feeder are exemplified as the first component device and the second component device. According to this, it is disclosed that it is possible to specify which of the suction nozzle and the feeder is a cause of the abnormality.

Patent Literature

Patent Literature 1: JP-A-2010-238689

BRIEF SUMMARY

Technical Problem

Incidentally, in Patent Literature 1, in a case where the error occurrence status is not favorable, one individual of the suction nozzle and the feeder is inevitably estimated to be a cause. However, actually, both the suction nozzle and the feeder may include a causative individual. Neither the suction nozzle nor the feeder may be a cause. For example, there may be a case where another device such as a reel on which a carrier tape is wound or a mounting head configured to hold a suction nozzle is a cause. There may be a case where there is no failure in a device and data used for mounting work is a cause. As described above, in consideration of the probability that there may be multiple causative individuals or three or more factors that may be causes, it is difficult to perform highly reliable estimation according to the technique disclosed in Patent Literature 1.

In the method of the conventional art using the ranking form, one mounting error is counted by multiple factors (devices or data). As a result, even for a favorable factor that cannot be a cause, the number of mounting errors is counted up. Thus, it is difficult for an operator to accurately estimate factors and causative individuals that are significantly involved in an actual mounting error by merely looking at the ranking.

An object of the present specification is to provide a mounting error cause estimation device and a mounting error cause estimation method capable of estimating an individual causing a mounting error with higher reliability than in the conventional art.

Solution to Problem

According to the present specification, there is provided a device for estimating a cause of a mounting error including an error history storage section configured to aggregate and store an error occurrence status of a mounting error that mounting work of mounting a component on a board has failed in a component mounter by dividing the error occurrence status into either individuals of one or more types of devices used for the mounting work or individuals of one or more types of data used for the mounting work, or both; a factor setting section configured to select two types of factors from among the devices and the data and to respectively set the selected factors as a first factor and a second factor; a first determination section configured to perform a process of obtaining the error occurrence status for each individual as the second factor under a condition that an individual as the first factor is specified and determining whether the obtained error occurrence status is biased according to a difference in the second factor, on each of multiple individuals as the first factor; a second determination section configured to perform a process of obtaining the error occurrence status for each individual as the first factor under a condition that an individual as the second factor is specified and determining whether the obtained error occurrence status is biased according to a difference in the first factor, on each of multiple individuals as the second factor; and a cause estimation section configured to estimate a causative individual causing the mounting error based on a first determination result in the first determination section and a second determination result in the second determination section.

According to the present specification, there is provided a method for estimating a cause of a mounting error including an error history storage step of aggregating and storing an error occurrence status of a mounting error that mounting work of mounting a component on a board has failed in a component mounter by dividing the error occurrence status into either individuals of one or more types of devices used for the mounting work or individuals of one or more types of data used for the mounting work, or both; a factor setting step of selecting two types of factors from among the devices and the data and respectively setting the selected factors as a first factor and a second factor; a first determination step of performing a process of obtaining the error occurrence status for each individual as the second factor under a condition that an individual as the first factor is specified and determining whether the obtained error occurrence status is biased according to a difference in the second factor, on each of multiple individuals as the first factor; a second determination step of performing a process of obtaining the error occurrence status for each individual as the first factor under a condition that an individual as the second factor is specified and determining whether the obtained error occurrence status is biased according to a difference in the first factor, on each of multiple individuals as the second factor; and a cause estimation step of estimating a causative individual causing the mounting error based on a first determination result in the first determination step and a second determination result in the second determination step.

Advantageous Effects

In the mounting error cause estimation device and the mounting error cause estimation method disclosed in the present specification, determination and estimation based on the following basic concepts are performed. That is, when a causative individual as a certain factor that causes a mounting error is used, the mounting error occurs even if combined individuals as other factors are replaced, and thus an error occurrence status is not biased according to a difference between the other factors. On the other hand, when a favorable individual as a certain factor is used, a mounting error increases or decreases in accordance with the good or bad quality of combined individuals as other factors, and thus an error occurrence status is biased according to a difference between the other factors.

Specifically, the cause estimation device selects two types of factors that may cause the mounting error, and performs a process, on each of multiple individuals as the first factor, of determining whether an error occurrence status is biased according to a difference in the second factor under a condition that the individual as the first factor is specified. The cause estimation device performs the multiple processes while replacing the first factor and the second factor. In other words, the cause estimation device performs determination from two directions, acquires multiple determination results, and provides the determination results to estimation of a causative individual. Therefore, the cause estimation device can estimate a causative individual with higher reliability than in the conventional art based on multiple determination results. In the cause estimation method, it is possible to estimate a causative individual with higher reliability than in the conventional art by performing the same process.

BRIEF DESCRIPTION OF DRAWINGS

FIG. 6 is a diagram of a list exemplifying an error occurrence status for each combination of arrangement data and a suction nozzle in Example 2.

DESCRIPTION OF EMBODIMENTS

1. Configuration Example of Component Mounter 1

Figure 1:
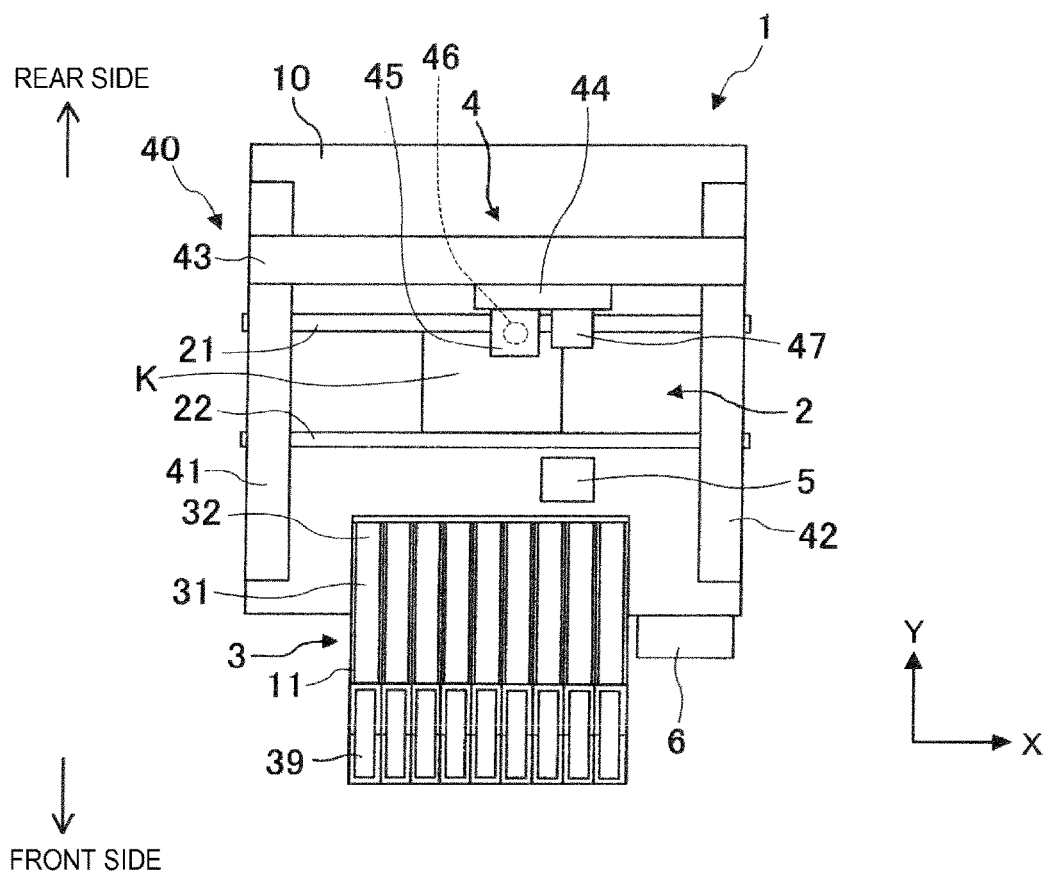
FIG. 1 is a plan view schematically illustrating a configuration example of a component mounter to which a mounting error cause estimation device of an embodiment is applied.

First, a configuration example of component mounter 1 to which a mounting error cause estimation device 8 (refer to FIG. 2) of an embodiment is applied will be described with reference to FIG. 1. Component mounter 1 performs mounting work of mounting a component onto board K. A direction from left toward right on the drawing surface in FIG. 1 in which board K is conveyed is an X-axis direction, and a direction from the bottom (front side) toward the top (rear side) on the drawing surface is a Y-axis direction. Component mounter 1 is configured by assembling board conveyance device 2, multiple feeders 3, component transfer device 4, component camera 5, control device 6, and the like to base 10.

Board conveyance device 2 includes a pair of guide rails 21 and 22, a pair of conveyor belts, a board clamping mechanism, and the like. The conveyor belts convey board K into a work execution position by being rotated along guide rails 21 and 22 in a state in which board K is placed on the conveyor belts. The board clamping mechanism pushes up board K at the work execution position to clamp and position board K. When component mounting work is finished, the board clamping mechanism releases board K. Subsequently, the conveyor belts convey out board K.

Multiple feeders 3 are detachably attached to multiple groove-shaped slots provided in pallet member 11 on base 10. In feeder 3, reel 39 is loaded on the front side of main body portion 31. Predetermined supply position 32 for supplying components is set at the top portion near the rear side of main body portion 31. A carrier tape in which components are housed in multiple cavities is wound around reel 39. Feeder 3 intermittently feeds the carrier tape by a tape feeding mechanism (not illustrated) to set a component at supply position 32. Consequently, feeder 3 sequentially performs a component supply operation.

Feeder 3 is assigned with identification information to be managed. The identification information is displayed with a label or the like on which a barcode is printed. A control section (not illustrated) of feeder 3 stores the identification information and has a function of transmitting the identification information by using communication. Information regarding the type of component housed in reel 39 is displayed by attaching a label on which a barcode is printed to reel 39. The identification information or the information regarding the type of component may be assigned to other display locations and display methods than the above methods.

Component transfer device 4 is disposed above board conveyance device 2 or feeder 3. Component transfer device 4 picks up a component from feeder 3 and mounts the component on board K. Component transfer device 4 includes head driving mechanism 40, moving table 44, mounting head 45, suction nozzle 46, mark camera 47, and the like. Head driving mechanism 40 is configured to include a pair of Y-axis rails 41 and 42, Y-axis slider 43, and a drive motor (not illustrated). Y-axis rails 41 and 42 extend in the Y-axis direction and are disposed in parallel to be spaced apart from each other. Long Y-axis slider 43 in the X-axis direction is mounted across both Y-axis rails 41 and 42 and is moved in the Y-axis direction. Moving table 44 is mounted on Y-axis slider 43 and is moved in the X-axis direction. Head driving mechanism 40 drives Y-axis slider 43 in the Y-axis direction and drives moving table 44 on Y-axis slider 43 in the X-axis direction.

Moving table 44 holds mounting head 45 and mark camera 47. Mounting head 45 holds one or multiple suction nozzles 46 on the lower side and is driven by head driving mechanism 40 to be moved in two horizontal directions. Suction nozzle 46 performs lifting and lowering operations by being driven by a lifting/lowering driving section (not illustrated). Suction nozzle 46 is lowered from above supply position 32, and performs a pickup operation of suction-picking up a component due to the supply of a negative pressure. Suction nozzle 46 is driven above board K, and performs a mounting operation of mounting a component due to the supply of a positive pressure. There are multiple types of mounting heads 45 or suction nozzles 46, which are automatically or manually exchanged. Mark camera 47 images a position mark attached to positioned board K, and thus detects an accurate work execution position for board K.

Component camera 5 is provided to face upward on an upper surface of base 10 between board conveyance device 2 and feeder 3. Component camera 5 images a component in a state of being picked up by suction nozzle 46 while moving table 44 is moved from feeder 3 to board K. An image processing section of component camera 5 performs image processing on acquired image data to determine the presence or absence of a component and the correctness of the component, and further acquires a suction posture of the component. A result of the image processing is reflected in a mounting operation for suction nozzle 46.

Control device 6 is assembled to base 10, and a disposition position thereof is not particularly limited. Control device 6 is configured by a computer device having a CPU and operated with software. Control device 6 may be configured such that multiple CPUs are distributed inside. Control device 6 controls component mounting work in accordance with job data stored in advance. The job data differs depending on the type of board product to be produced.

2. Configuration Related to Control of Component Mounter 1 and Management Computer 7

Figure 2:
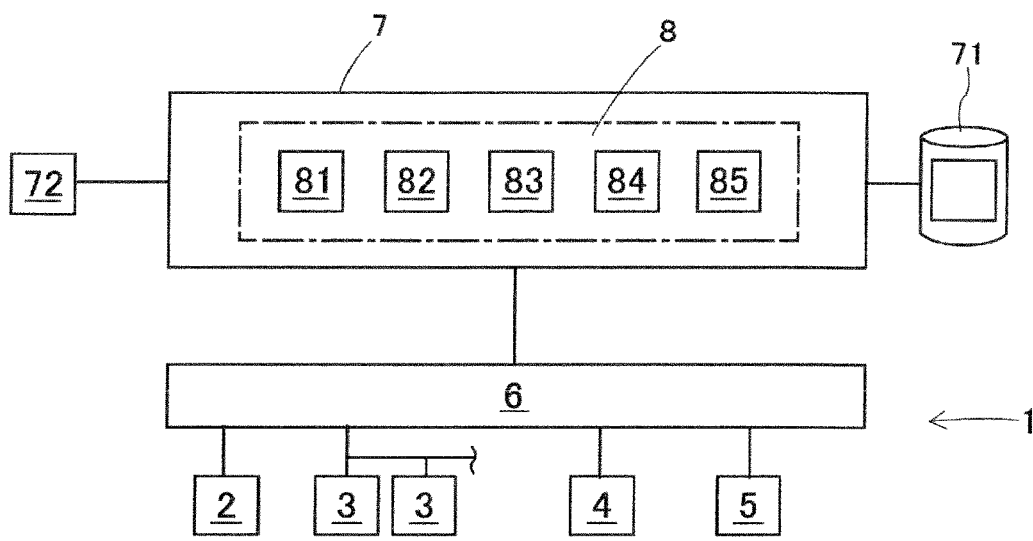
FIG. 2 is a block diagram illustrating a configuration related to control of the cause estimation device.

As illustrated in FIG. 2, control device 6 controls board conveyance device 2, multiple feeders 3, component transfer device 4, and component camera 5. Management computer 7 is provided as an upper-level control device controlling component mounter 1. Control device 6 of component mounter 1 and management computer 7 are connected to each other through wired or wireless communication. Management computer 7 transmits a command related to board product mounting work to control device 6. Control device 6 transmits information a regarding progress status of the mounting work to management computer 7. Management computer 7 may collectively control multiple component mounters 1 and another type of board work machine.

Management computer 7 has storage device 71 for storing various data required for management. Management computer 7 also includes barcode reader 72 operated by an operator. Barcode reader 72 reads the barcode displayed on feeder 3 to acquire the identification information of feeder 3. Barcode reader 72 reads the barcode displayed on the reel to acquire information regarding the type of component. The information acquired by barcode reader 72 is stored into storage device 71. In a case where a display method of the identification information of feeder 3 and the information regarding the type of the component is different from the barcode, a device other than barcode reader 72 is used in correspondence with the display method.

3. Devices and Data Used for Mounting Work

Next, devices and data used for the mounting work will be described. Component mounter 1 performs the mounting work by repeating a pickup-mounting cycle. The pickup-mounting cycle refers to a series of work in which mounting head 45 is moved above feeder 3, suction nozzle 46 picks up a component, mounting head 45 is moved above component camera 5, component camera 5 captures an image, mounting head 45 is moved above board K, and suction nozzle 46 mounts the component on board K. During the pickup-mounting cycle, multiple devices and multiple data are used.

Figure 3:
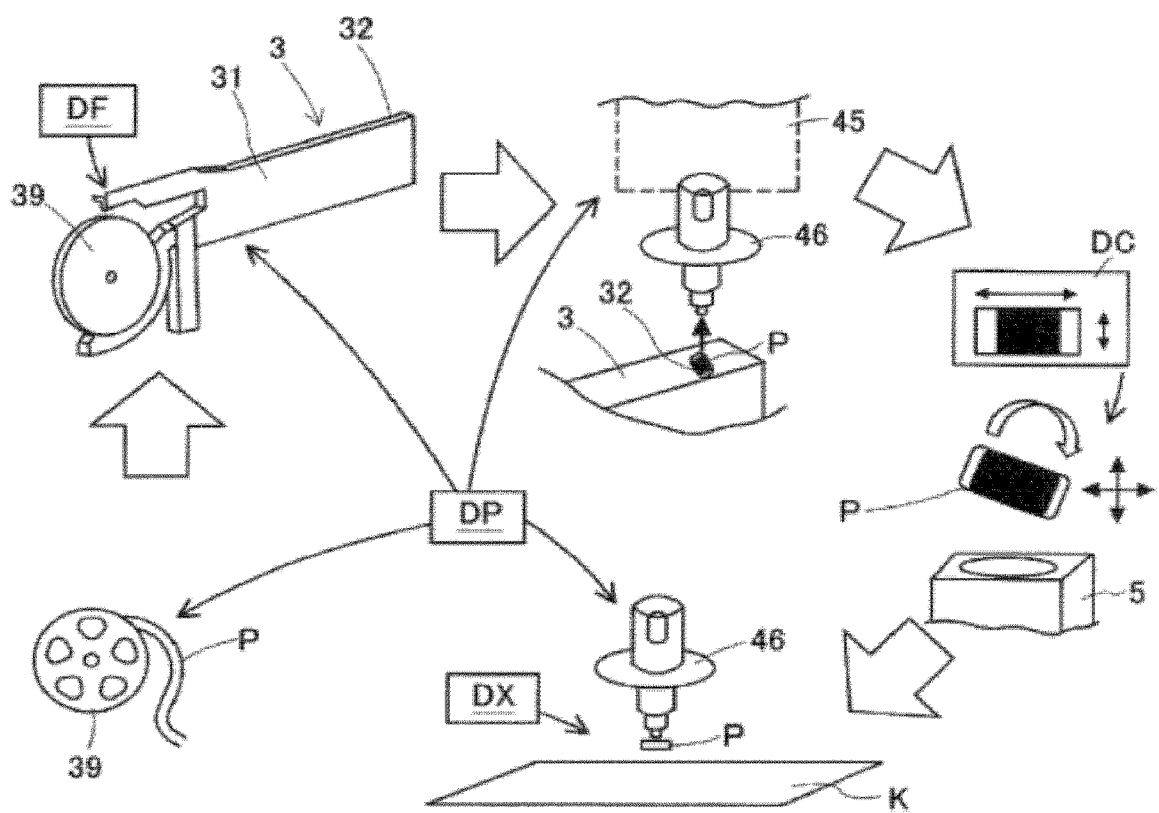
FIG. 3 is a diagram illustrating a device and data used for mounting work.

As illustrated in FIG. 3, the devices used for the mounting work include reel 39, feeder 3, mounting head 45, suction nozzle 46, and component camera 5. Reel 39, feeder 3, and component camera 5 are related to a supply operation for component P. Mounting head 45 and suction nozzle 46 are related to a pickup operation and a mounting operation for component P. The data used for the mounting work includes component data DP, shape data DC, arrangement data DF, and coordinate data DX. Component data DP, shape data DC, and arrangement data DF are related to the supply operation for component P. Component data DP and coordinate data DX relate to the pickup operation and the mounting operation for component P.

Component data DP defines properties and handling conditions of component P. Specifically, component data DP defines a packaging form, a storage condition, and the like in addition to properties such as electrical characteristic values of component P, errors thereof, and usage environmental conditions. Component data DP defines handling conditions such as a specification of reel 39, the type of feeder 3 or suction nozzle 46 to be used, a movement speed of mounting head 45, and a lifting-lowering speed of suction nozzle 46. Component data DP includes shape data DC.

Shape data DC defines an appearance shape of component P such as sizes of a length, a width and a height of component P, allowable errors of the sizes, a position of a lead, an appearance color, and the like. Shape data DC may include imaging conditions such as a shutter speed and lighting conditions when an image is captured by component camera 5. Shape data DC is used for image processing, and it is determined whether there is component P picked up by suction nozzle 46, an error in the type, or the like. A posture such as a position and rotation of component P with respect to suction nozzle 46 is acquired.

Arrangement data DF defines slot positions of pallet member 11 in which multiple feeders 3 are arranged. Coordinate data DX defines a position of board K on which component P is mounted. Coordinate data DX is included in the job data described above. Pieces of data (DP, DC, DF, and DX) are stored in storage device 71 of management computer 7. Pieces of data (DP, DC, DF, and DX) are attached to a command and transmitted to control device 6, or are accessible from control device 6.

When devices (39, 3, 45, 46, and 5) contain defects or the performance thereof decreases, the number of mounting errors corresponding to failures in the mounting work increases. Even if devices (39, 3, 45, 46, and 5) are operated normally, when there is a problem in the data (DP, DC, DF, and DX), the number of mounting errors also increases. Arrangement data DF has a different meaning from other pieces of data (DP, DC, and DX). That is, arrangement data DF does not include a problem in the content itself of the data, but indirectly represents a problem in the structure of the slot provided in pallet member 11.

4. Mounting Error Cause Estimation Device 8 of Embodiment

A description will be made of mounting error cause estimation device 8 of the embodiment. As illustrated in FIG. 2, cause estimation device 8 is implemented by software of management computer 7. The present disclosure is not limited to this. Cause estimation device 8 may be provided in control device 6 or in another computer communicatively connected to management computer 7. Cause estimation device 8 includes five functional sections, that is, error history storage section 81, factor setting section 82, first determination section 83, second determination section 84, and cause estimation section 85.

Error history storage section 81 aggregates error occurrence statuses of mounting errors according to individuals of devices and individuals of data, and stores the error occurrence statuses into storage device 71. The mounting errors are detected by the image processing section of component camera 5. The image processing section transmits information regarding the mounting errors detected through image processing to control device 6. Every time the mounting work is finished, control device 6 may transmit information regarding whether a mounting error has occurred to management computer 7. Alternatively, control device 6 may aggregate the number of mounting errors or the like after a predetermined number of times of mounting work, and transmit information regarding an aggregation result to management computer 7.

The mounting error may be detected by a board inspection machine provided in a downstream process of component mounter 1 to inspect component P mounted on board K. Every time inspection of one board K is finished, the board inspection machine transmits information regarding an error occurrence status to management computer 7. Error history storage section 81 of management computer 7 performs aggregation based on the information received from control device 6 or the board inspection machine, and stores an aggregation result.

Examples of the mounting error may include the following cases 1) to 7). In the cases 5) and 6), a problem in a mounting operation of suction nozzle 46 is detected, an image is captured by component camera 5 again, and a mounting error is confirmed.
1) A case where image data was not acquired by component camera 5
2) A case where image data was not subjected to appropriate image processing
3) A case where it was determined that suction nozzle 46 did not pick up component P as a result of the image processing
4) A case where an error in a posture of component P was large as a result of the image processing and it was determined that mounting work was impossible
5) A case where component P dropped from suction nozzle 46 during movement to board K
6) A case where component P remained picked up by suction nozzle 46 and thus was not mounted on board K
7) A case where the board inspection machine determined that component P was absent on board K or that a position or a posture of component P was defective The error occurrence status is represented by a combination of number NU of uses of being used in the mounting work and number NE of occurrences of mounting errors. An error occurrence ratio obtained by dividing number NE of occurrences by number NU of uses is used as a reference index, and is not used for determining whether there is a bias, which will be described later. This is because the error occurrence ratio is not effective as an index for estimating a causative individual when a statistical test method (that will be described later) is used for determining whether there is a bias.

Factor setting section 82 selects two types of factors that may cause a mounting error from among the devices and the data used for the mounting work, and sets the selected factors as a first factor and a second factor. It is preferable that factor setting section 82 sets a device or data related to the supply operation for component P as the first factor, and sets a device or data related to the pickup operation and the mounting operation for component P as the second factor. As a result of this setting, cause estimation device 8 can clearly estimate whether a causative individual causing a pickup error is present on the supply side of component P or the use side of component P.

For example, feeder 3 related to the supply operation is set as the first factor, and suction nozzle 46 related to the pickup operation and the mounting operation is set as the second factor. For example, arrangement data DF related to the supply operation is set as the first factor, and coordinate data DX related to the mounting operation is set as the second factor. A combination of one type of device and one type of data may be selected as two factors. Specifically, factor setting section 82 executes any of the following first to third setting methods.

The first setting method) Factor setting section 82 displays multiple devices and data as candidates on a display screen of management computer 7. The operator selects and designates two factors from among the displayed candidates. Factor setting section 82 performs a setting operation according to the designation.

The second setting method) The operator designates a first combination of the first factor and the second factor in advance. Factor setting section 82 performs the setting operation according to the designated first combination. In this case, the second combination and the subsequent combinations may be designated in advance, or may be designated by the operator in the future.

The third setting method) Factor setting section 82 automatically sets, in order, multiple combinations each including any of multiple first factors that are settable and any of multiple second factors that are settable. In this case, first determination section 83, second determination section 84, and cause estimation section 85 are operated with respect to each of a total number of the multiple combinations.

In the first and second setting methods, the operator may preferentially set important factors that are likely to include a causative individual. Consequently, a process on an unimportant factor is omitted, and thus a sufficient estimation result is acquired in a short time. In the third setting method, processes on all combinations are automatically performed. Consequently, a sufficient estimation result can be reliably acquired, and labor saving can be realized by eliminating the time and effort for designation by the operator.

First determination section 83 obtains an error occurrence status for each of individuals as the second factors under the condition that an individual as the first factor is specified. First determination section 83 determines whether the obtained error occurrence status is biased according to a difference between the second factors. First determination section 83 determines a probability of the individual specified as the first factor and each individual as the second factor being causative individuals based on whether the error occurrence status is biased, and sets a determination result as a first determination result.

Specifically, in a case where the error occurrence status is biased, first determination section 83 determines that the individual specified as the first factor is not a causative individual, and determines a probability of a specific individual of which the error occurrence status is inferior among the individuals as the second factors being a causative individual, and sets a determination result as the first determination result. In a case where the error occurrence status is not biased and is favorable, first determination section 83 determines that the individual specified as the first factor is not a causative individual, further determines that the second factors do not include a causative individual, and sets a determination result as the first determination result.

In a case where the error occurrence status is not biased and is not favorable, first determination section 83 determines a probability of the individual specified as the first factor being a causative individual, and sets a determination result as the first determination result. First determination section 83 performs the above-described determination process on each of multiple individuals as the first factors. First determination section 83 uses a statistical test method as a method of determining the presence or absence of a bias. The statistical test method will be described later in the description of Example 1.

Second determination section 84 performs determination in which the first factor and the second factor are exchanged with each other in comparison with first determination section 83. That is, second determination section 84 obtains an error occurrence status for each of individuals as the first factors under the condition that an individual as the second factor is specified. Second determination section 84 determines whether the obtained error occurrence status is biased according to a difference between the first factors. Second determination section 84 determines a probability of the individual specified as the second factor and each individual as the first factor being causative individuals based on whether the error occurrence status is biased, and sets a determination result as a second determination result.

Specifically, in a case where the error occurrence status is biased, second determination section 84 determines that the individual specified as the second factor is not a causative individual, and determines a probability of a specific individual of which the error occurrence status is inferior among the individuals as the first factors being a causative individual, and sets a determination result as the second determination result. In a case where the error occurrence status is not biased and is favorable, second determination section 84 determines that the individual specified as the second factor is not a causative individual, further determines that the first factors do not include a causative individual, and sets a determination result as the second determination result.

In a case where the error occurrence status is not biased and is not favorable, second determination section 84 determines a probability of the individual specified as the second factor being a causative individual, and sets a determination result as the second determination result. Second determination section 84 performs the above-described determination process on each of multiple individuals as the second factors. Second determination section 84 uses a statistical test method in the same manner as first determination section 83.

First determination section 83 and second determination section 84 set regulated number M0 of individuals of which an error occurrence status is inferior as determination targets with respect to each of the first factor and the second factor. In this case, the error occurrence ratio is used as a reference index to exclude individuals in an amount exceeding regulated number M0 from the determination targets. The determination targets are narrowed down in the above-described way, and thus an excellent individual that cannot be a causative individual is excluded. Consequently, the determination process of first determination section 83 and second determination section 84 and the estimation process of cause estimation section 85 are simplified.

First determination section 83 and second determination section 84 set an individual of which number NU of uses is equal to or more than regulated number N0 of uses as a determination target with respect to each of the first factor and the second factor. First determination section 83 and second determination section 84 set an individual of which number NE of occurrences of mounting errors is equal to or more than minimum number ME of errors as a determination target with respect to each of the first factor and the second factor. The determination targets are narrowed down in the above-described way, and thus the test accuracy of the statistical test method can be increased.

Cause estimation section 85 estimates a causative individual that causes the mounting error based on the first determination result from first determination section 83 and the second determination result from second determination section 84. Specifically, cause estimation section 85 estimates a causative individual satisfying the first determination result and the second determination result in a case where the first determination result and the second determination result do not conflict with each other. It is assumed that cause estimation section 85 cannot estimate a causative individual in a case where the first determination result and the second determination result conflict with each other.

For example, in a case where neither the first factor nor the second factor includes a causative individual, it is natural that a causative individual is not estimated. In a case where both the first factor and the second factor include causative individuals, causative individuals may be estimated, or causative individuals may not be estimated due to conflicts. Even in a case where a causative individual cannot be estimated, cause estimation device 8 is likely to be able to estimate the causative individual by changing a combination of the first factor and the second factor and performing determination and estimation again. The functions of the five functional sections will be specifically described in the following examples.

EXAMPLES

5. Example 1

Next, operations and actions of mounting error cause estimation device 8 of the embodiment will be described by using Example 1. In the following descriptions, regulated number M0 is set to three, regulated number N0 of uses is set to 300, and minimum number ME of errors is set to one. Cause estimation device 8 executes a process flow illustrated in FIG. 4 in parallel with the mounting work of component mounter 1.

Figures 4, 5:
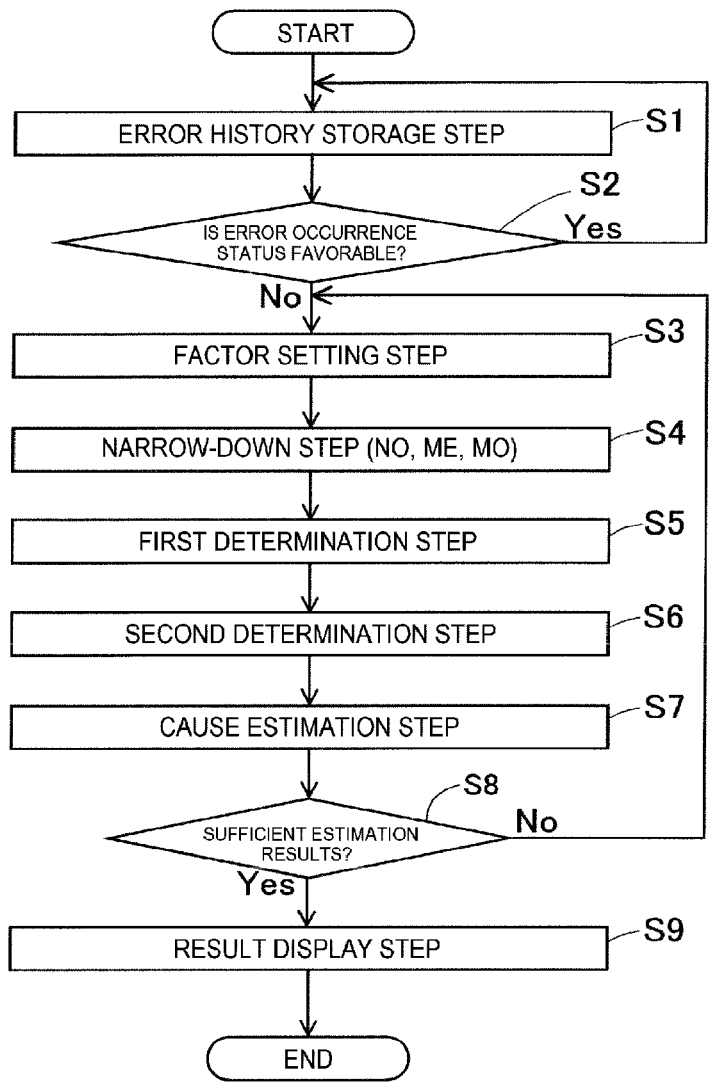
FIG. 4 is a process flowchart illustrating an operation of the cause estimation device of the embodiment.
FIG. 5 is a diagram of a list exemplifying an error occurrence status for each combination of a feeder and a suction nozzle in Example 1.

In error history storage step S1 in FIG. 4, error history storage section 81 of cause estimation device 8 aggregates error occurrence statuses and stores the error occurrence statuses into storage device 71. In the next step S2, cause estimation device 8 examines whether an error occurrence status is favorable. Cause estimation device 8 may determine whether the error occurrence status is favorable, for example, based on a comprehensive error occurrence ratio in which the number of times of all the mounting work performed in component mounter 1 is a modulus. While the number of occurrences of mounting errors is small and thus the error occurrence status is favorable, error history storage steps S1 and S2 are repeatedly executed.

When the error occurrence status is unfavorable in step S2, the execution of the process flow proceeds to factor setting step S3. In this case, component mounter 1 may continue the mounting work or may stop the mounting work. In factor setting step S3, factor setting section 82 sets a combination of the first factor and the second factor according to any of the first to third setting methods. As a result of this setting, cause estimation device 8 can acquire a list of the error occurrence statuses exemplified in FIG. 5.

In the list, feeder 3 is set as the first factor, and suction nozzle 46 is set as the second factor. In order to simplify the following description, it is assumed that the number of feeders 3 is five including first feeder FD1 to fifth feeder FD5, and the number of suction nozzles 46 is five including first suction nozzle NZ1 to fifth suction nozzle NZ5. Actually, a larger number of feeders 3 and suction nozzles 46 are used for the mounting work. Fractions are indicated in respective columns at which feeders 3 arranged in the vertical direction of the list intersect suction nozzles 46 arranged in the horizontal direction.

A denominator of the fraction represents number NU of uses for which the combination was used in the mounting work, and a numerator thereof represents number NE of occurrences of mounting errors. For example, it is expressed that the combination of first feeder FD1 and first suction nozzle NZ1 has one as number NE of occurrences of the mounting errors out of 200 as number NU of uses. For example, it is expressed that the combination of second feeder FD2 and second suction nozzle NZ2 has zero as number NU of uses and thus has not been used.

In the list in FIG. 5, it is sensually estimated by the operator that the error occurrence status of second suction nozzle NZ2 is not favorable. However, a delicate error occurrence status in which sensual estimation is difficult may occur. When causative individuals are present in both the first factor and the second factor, it is difficult for even a skilled operator to perform accurate estimation. Cause estimation device 8 objectively and accurately estimates a causative individual based on a determination result using statistics without depending on a skilled operator.

In the next narrow-down step S4, first determination section 83 and second determination section 84 narrow down individuals as determination targets. First, first determination section 83 and second determination section 84 exclude an individual of number NU of uses is less than 300 as regulated number N0 of uses from the determination targets. Second feeder FD2 has only a total of 200 as number NU of uses in combination with first suction nozzle NZ1 and third suction nozzle NZ3, and is thus excluded. Other individuals (FD1, FD3 to FD5, and NZ1 to NZ5) are not excluded since each individual has 300 or more as number NU of uses.

Next, first determination section 83 and second determination section 84 exclude an individual for which number NE of occurrences of mounting errors is less than one as the minimum number ME of errors from the determination targets. Fifth suction nozzle NZ5 is excluded since number NE of occurrences is zero out of a total of 300 as number NU of uses in combination with first feeder FD1, third feeder FD3, and fifth feeder FD5. Other individuals (FD1, FD3 to FD5, and NZ1 to NZ4) are not excluded since each individual has one or more as number NE of occurrences.

Next, first determination section 83 and second determination section 84 set regulated number M0 (=3) of individuals of which an error occurrence status is inferior as determination targets of each factor. In this case, the error occurrence ratio as a reference index is used, and third feeder FD3, fourth feeder FD4, and fifth feeder FD5, and second suction nozzle NZ2, third suction nozzle NZ3, and fourth suction nozzle NZ4 are left as determination targets. Excellent first feeder FD1 and first suction nozzle NZ1 that cannot be causative individuals are excluded. As a result, nine columns surrounded by thick lines are set as determination targets.

In the next first determination step S5, first determination section 83 determines whether the error occurrence status is biased according to a difference between suction nozzles 46 that are the second factors under a condition that an individual of feeder 3 that is the first factor is specified, and obtains first determination results. First, specifically, first determination section 83 sets a condition that third feeder FD3 is specified. Next, first determination section 83 determines whether the error occurrence status of each individual of suction nozzles 46 is biased according to a difference between suction nozzles 46 under the set condition.

In other words, first determination section 83 determines whether the following three types of error occurrence statuses a) to c) are biased.
a) A status in which number NE of occurrences of mounting errors is four out of 100 as number NU of uses of second suction nozzle NZ2
b) A status in which number NE of occurrences of mounting errors is one out of 100 as number NU of uses of third suction nozzle NZ3
c) A status in which number NE of occurrences of mounting errors is zero out of 100 as number NU of uses of fourth suction nozzle NZ4

First determination section 83 uses a statistical test method, specifically, a method called "test of the difference in the population ratio" to determine whether there is a bias. In this test method, statistical processing using number NU of uses and number NE of occurrences is performed to test whether there is a significant difference between multiple events (error occurrence statuses). As a criterion for determining the significant difference, a probability of occurrence of 5% may be exemplified. Details of this test method are explained in the literature "As to Statistical Analysis" (ISBN978-4-7741-4270-8) and the Internet literature "Test of Ratios/Test of Independence" (Lecture Document "Basic Computer A for Social Sciences" by the Department of Social Sciences, Waseda University).

As an easy-to-understand example, two events are assumed in which the number of appearances of a "one-spot" by throwing two dice six times is one in the first dice and two in the second dice. The appearance of the "one-spot" corresponds to the occurrence of a mounting error.

Here, it is hypothesized that the two dice have the same performance, such as a probability of the appearance of the "one-spot" being (1/6). On the other hand, the actual event is one and two out of six. Nonetheless, the difference "one" is an event that may occur accidentally and a probability of occurrence thereof is more than 5% as the determination criterion. Thus, the hypothesis is not rejected and the two dice are tested as having no significant difference in performance.

In contrast, two events are assumed in which the number of appearances of a "one-spot" by throwing two dice sixty times is ten in the first dice and twenty in the second dice. In this event, a probability of the occurrence of the "one-spot" is the same as that in the case of throwing the dice six times. However, for the same hypothesis, the probability of occurrence of an event in which the "one-spot" appears twenty times in the second dice is less than 5% as the determination criterion. Thus, the hypothesis is rejected and the two dice are tested as having a significant difference (bias) in the performance. That is, it is evident that the probability of the appearance of the "one-spot" in the second dice is larger than (1/6). For example, it is estimated that two sides out of the six sides of the second dice have the "one-spot".

As in the above example, in the "test of the difference in the population ratio", the test accuracy is increased as number NU of uses is increased. From this viewpoint, regulated number N0 of uses is set. The error occurrence ratio is not effective as an index for estimating a causative individual. It is important that number NU of uses and number NE of occurrences on which the error occurrence ratio is based are used for the test without any change of numerical values thereof.

Returning to the main subject, first determination section 83 may determine that the error occurrence statuses of third suction nozzle NZ3 and fourth suction nozzle NZ4 are not biased. First determination section 83 may determine that the error occurrence status of second suction nozzle NZ2 is biased to be inferior to those of third suction nozzle NZ3 and fourth suction nozzle NZ4. Since the error occurrence status is biased, first determination section 83 determines that specified third feeder FD3 is not a causative individual, determines a probability of second suction nozzle NZ2 having an inferior error occurrence status being a causative individual among the individuals of suction nozzles 46, and sets a determination result as a first-first determination result.

First determination section 83 performs the same determination process on each of fourth feeder FD4 and fifth feeder FD5. Hereinafter, detailed description of the progress of the determination process will be omitted, and the determination result will be described.

First determination section 83 may determine that the error occurrence statuses of third suction nozzle NZ3 and fourth suction nozzle NZ4 are not biased under the condition that fourth feeder FD4 is specified. First determination section 83 may determine that the error occurrence status of second suction nozzle NZ2 is biased to be inferior to those of third suction nozzle NZ3 and fourth suction nozzle NZ4. Since the error occurrence status is biased, first determination section 83 determines that specified fourth feeder FD4 is not a causative individual, determines a probability of second suction nozzle NZ2 having an inferior error occurrence status being a causative individual among the individuals of suction nozzles 46, and sets a determination result as a second-first determination result.

First determination section 83 may determine that the error occurrence statuses of third suction nozzle NZ3 and fourth suction nozzle NZ4 are not biased under the condition that fifth feeder FD5 is specified. First determination section 83 may determine that the error occurrence status of second suction nozzle NZ2 is biased to be inferior to those of third suction nozzle NZ3 and fourth suction nozzle NZ4. Since the error occurrence status is biased, first determination section 83 determines that specified fifth feeder FD5 is not a causative individual, determines a probability of second suction nozzle NZ2 having an inferior error occurrence status being a causative individual among the individuals of suction nozzle 46, and sets a determination result as a third-first determination result.

In the next second determination step S6, second determination section 84 determines whether the error occurrence status is biased according to a difference between feeders 3 that are the first factors under a condition that an individual of suction nozzle 46 that is the second factor is specified, and obtains second determination results. First, specifically, second determination section 84 sets a condition that second suction nozzle NZ2 is specified. Next, second determination section 84 determines whether the error occurrence status of each individual of feeders 3 is biased according to a difference between feeders 3 under the set condition.

In other words, second determination section 84 determines whether the following three types of error occurrence statuses d) to f) are biased.
d) A status in which number NE of occurrences of mounting errors is four out of 100 as number NU of uses of third feeder FD3
e) A status in which number NE of occurrences of mounting errors is five out of 100 as number NU of uses of fourth feeder FD4
f) A status in which number NE of occurrences of mounting errors is seven out of 100 as number NU of uses of fifth feeder FD5

Second determination section 84 uses a method called "test of the difference in the population ratio" in the same manner as first determination section 83. Second determination section 84 may determine that the error occurrence statuses of third feeder FD3, fourth feeder FD4, and fifth feeder FD5 are not biased and are not favorable. Second determination section 84 determines a probability of the specified second suction nozzle NZ2 being a causative individual, and sets a determination result as a first-second determination result.

Second determination section 84 performs the same determination process on each of third suction nozzle NZ3 and fourth suction nozzle NZ4. That is, second determination section 84 may determine that the error occurrence statuses of third feeder FD3, fourth feeder FD4, and fifth feeder FD5 are not biased and are favorable under the condition that third suction nozzle NZ3 is specified. Second determination section 84 determines that specified third suction nozzle NZ3 is not a causative individual, and determines that feeder 3 does not include a causative individual, and sets a determination result as a second-second determination result.

Second determination section 84 may determine that the error occurrence statuses of third feeder FD3, fourth feeder FD4, and fifth feeder FD5 are not biased and are favorable under the condition that fourth suction nozzle NZ4 is specified. Second determination section 84 determines that specified fourth suction nozzle NZ4 is not a causative individual, and determines that feeder 3 does not include a causative individual, and sets a determination result as a third-second determination result.

In the next cause estimation step S7, cause estimation section 85 estimates a causative individual causing the mounting error based on the first-first to third-first determination results in first determination section 83 and the first-second to third-second determination results in second determination section 84. A total of six determination results do not conflict with each other. Cause estimation section 85 may estimate a causative individual that satisfies a total of six determination results. Specifically, cause estimation section 85 may estimate that second suction nozzle NZ2 is a causative individual. Cause estimation section 85 may estimate that third feeder FD3, fourth feeder FD4, and fifth feeder FD5 are not causative individuals. Cause estimation section 85 may estimate that third suction nozzle NZ3 and fourth suction nozzle NZ4 are not causative individuals.

In the next step S8, it is determined whether a sufficient estimation result has been obtained. When factor setting section 82 uses the first or second setting method, the determination in step S8 is entrusted to the operator. When factor setting section 82 uses the third setting method, the determination in step S8 is automatically executed by factor setting section 82. That is, factor setting section 82 determines that a sufficient estimation result is not obtained while all the combinations of the first factors and the second factors are not finished.

In a case where a sufficient estimation result is not obtained, the execution of the process flow is returned to factor setting step S3. In second factor setting step S3, factor setting section 82 sets a combination different from the first combination of the first factor and the second factor. Thereafter, narrow-down steps S4 to S8 are repeatedly executed. In a case where a sufficient estimation result has been obtained in step S8, the execution of the process flow proceeds to result display step S9.

In result display step S9, cause estimation section 85 displays a final estimation result on a display device of management computer 7. Thus, the process flow is finished. In a case where component mounter 1 continues the mounting work when the execution of the process flow is advanced from step S2 to factor setting step S3, the process flow is not finished and is returned to error history storage step S1. As a result, cause estimation device 8 continues operations in accordance with the subsequent mounting work.

Mounting error cause estimation device 8 of the embodiment performs determination from two directions in which individuals as the first factor and the second factor are specified, acquires multiple determination results, and provides the results to estimation of a causative individual. Therefore, cause estimation device 8 can estimate a causative individual with higher reliability than in the conventional art based on multiple determination results.

6. Example 2

Next, operations and actions of cause estimation device 8 will be described by using Example 2. In Example 2, cause estimation device 8 may obtain a list of error occurrence statuses illustrated in FIG. 6. In this list, arrangement data DF is set as a first factor, and suction nozzle 46 is set as a second factor. Narrow-down step S4 is finished. That is, arrangement data DF is narrowed down to three such as first slot position SL1, third slot position SL3, and fifth slot position SL5. Suction nozzle 46 is narrowed down to three such as first suction nozzle NZ1, second suction nozzle NZ2, and fourth suction nozzle NZ4.

First determination section 83 may determine that the error occurrence statuses of first suction nozzle NZ1 and fourth suction nozzle NZ4 are not biased under the condition that first slot position SL1 is specified. First determination section 83 may determine that the error occurrence status of second suction nozzle NZ2 is biased to be inferior to those of first suction nozzle NZ1 and fourth suction nozzle NZ4. Since the error occurrence status is biased, first determination section 83 determines that specified first slot position SL1 is not a causative individual, determines a probability of second suction nozzle NZ2 being a causative individual, and sets a determination result as a first-first determination result.

First determination section 83 may determine that the error occurrence statuses of first suction nozzle NZ1, second suction nozzle NZ2, and fourth suction nozzle NZ4 are not biased and are not favorable under the condition that third slot position SL3 is specified. First determination section 83 determines a probability of specified third slot position SL3 being a causative individual, and sets a determination result as a second-first determination result.

First determination section 83 may determine that the error occurrence statuses of first suction nozzle NZ1 and fourth suction nozzle NZ4 are not biased under the condition that fifth slot position SL5 is specified. First determination section 83 may determine that the error occurrence status of second suction nozzle NZ2 is biased to be inferior to those of first suction nozzle NZ1 and fourth suction nozzle NZ4. Since the error occurrence status is biased, first determination section 83 determines that specified fifth slot position SL5 is not a causative individual, determines a probability of second suction nozzle NZ2 being a causative individual, and sets a determination result as a third-first determination result.

On the other hand, second determination section 84 may determine that the error occurrence statuses of first slot position SL1 and fifth slot position SL5 are not biased under the condition that first suction nozzle NZ1 is specified. Second determination section 84 may determine that the error occurrence status of third slot position SL3 is biased to be inferior to those of first slot position SL1 and fifth slot position SL5. Since the error occurrence status is biased, second determination section 84 determines that specified first suction nozzle NZ1 is not a causative individual, determines a probability of third slot position SL3 being a causative individual, and sets a determination result as a first-second determination result.

Second determination section 84 may determine that the error occurrence statuses of first slot position SL1, third slot position SL3, and fifth slot position SL5 are not biased and are not favorable under the condition that second suction nozzle NZ2 is specified. First determination section 83 determines a probability of specified second suction nozzle NZ2 being a causative individual, and sets a determination result as a second-second determination result.

Second determination section 84 may determine that the error occurrence statuses of first slot position SL1 and fifth slot position SL5 are not biased under the condition that fourth suction nozzle NZ4 is specified. Second determination section 84 may determine that the error occurrence status of third slot position SL3 is biased to be inferior to those of first slot position SL1 and fifth slot position SL5. Since the error occurrence status is biased, second determination section 84 determines that specified fourth suction nozzle NZ4 is not a causative individual, determines a probability of third slot position SL3 being a causative individual, and sets a determination result as a third-second determination result.

Cause estimation section 85 estimates a causative individual causing the mounting error based on the first-first to third-first determination results in first determination section 83 and the first-second to third-second determination results in second determination section 84. A total of six determination results do not conflict with each other. Cause estimation section 85 may estimate that third slot position SL3 and second suction nozzle NZ2 are causative individuals. Cause estimation section 85 may estimate that other individuals (SL1, SL5, NZ1, and NZ4) are not causative individuals. As described above, cause estimation device 8 can accurately estimate a causative individual that is present in both the first factor and the second factor. Third slot position SL3 being a causative individual represents a problem that, for example, distortion occurs in a shape of the slot or a metal fitting for fastening feeder 3 is damaged.

The error occurrence status may be determined as being biased on one of the second-first determination result and the second-second determination result. In this case, since conflicts occur in a total of six determination results, cause estimation section 85 cannot estimate a causative individual. Nevertheless, the first factor is replaced with another factor on the component supply side to perform determination and estimation again, and thus cause estimation device 8 can estimate that second suction nozzle NZ2 is a causative individual. The second factor is replaced with another factor on the component use side to perform determination and estimation again, and thus cause estimation device 8 can estimate that third slot position SL3 is a causative individual.

7. Other Applications and Modifications of Embodiment

Cause estimation device 8 of the embodiment performs a mounting error cause estimation method of the embodiment. In order to increase the test accuracy of the "test of the difference in the population ratio", a criterion for determining the significant difference may be made less than 5%. First determination section 83 and second determination section 84 may use other test methods as a method of determining whether there is a bias. Regulated number M0, regulated number N0 of uses, and minimum number ME of errors may be different from the exemplified numerical values, or need not be used as the narrowing-down conditions. A tray-type component supply device may be used instead of feeder 3. Various applications or modifications may occur in the embodiment and the Examples.

REFERENCE SIGNS LIST

1: Component mounter, 3: Feeder, 39: Reel, 4: Component transfer device, 45: Mounting head, 46: Suction nozzle, 5: Component camera, 6: Control device, 7: Management computer, 8: Pickup error cause estimation device, 81: Error history storage section, 82: Factor setting section, 83: First determination section, 84: Second determination section, 85: Cause estimation section, K: Board, P: Component, DP: Component data, DC: Shape data, DF: Arrangement data, DX: Coordinate data, FD1 to FD5: First to fifth feeders, NZ1 to NZ5: First to fifth suction nozzles, SL1, SL3, and SL5: First, third, and fifth slot positions

The invention claimed is:

1. A component mounter comprising:
a board conveyance device configured to convey a board;
a feeder configured to store a component to be mounted on the board;
a component transfer device including a suction nozzle configured to pick up one component from the feeder and mount the one component on the board; and
a control device configured to control the board conveyance device, the feeder, and the component transfer device to mount the component on the board,
wherein the control device is further configured to estimate a cause of a mounting error and includes:
an error history storage section configured to process and store an error occurrence status of a mounting error that mounting work of mounting a component on a board has failed in a component mounter by attributing the error occurrence status to either individuals of one or more types of devices used for the mounting work or individuals of one or more types of data used for the mounting work, or both;
a factor setting section configured to select two types of factors from at least one of the devices and the data and to respectively set the selected factors as a first factor and a second factor;
a first determination section configured to, for each individual of a determination target, perform a process of specifying the individual as the first factor, obtaining the error occurrence status for each individual as the second factor under a condition that the individual as the first factor is specified, and determining whether the obtained error occurrence status is biased according to a difference in the second factor;
a second determination section configured to, for each individual of the determination target, perform a process of specifying the individual as the second factor, obtaining the error occurrence status for each individual as the first factor under a condition that the individual as the second factor is specified, and determining whether the obtained error occurrence status is biased according to a difference in the first factor; and
a cause estimation section configured to identify a causative individual causing the mounting error based on a first determination result in the first determination section and a second determination result in the second determination section, and
wherein the control device is further configured to control the component mounter to mount another component after correcting the causative individual.

2. The component mounter according to claim 1, wherein the first determination section determines a probability of each of the individual specified as the first factor and the individual as the second factor being the causative individual based on whether the error occurrence status is biased, and sets a determination result as the first determination result, and
the second determination section determines a probability of each of the individual specified as the second factor and the individual as the first factor being the causative individual based on whether the error occurrence status is biased, and sets a determination result as the second determination result.

3. The component mounter according to claim 2, wherein the first determination section
determines that the individual specified as the first factor is not the causative individual and determines a probability of a specific individual of which the error occurrence status is inferior among the individuals of the determination target as the second factor being the causative individual in a case where the error occurrence status is biased, determines that the individual specified as the first factor is not the causative individual and further determines that the second factor does not include the causative individual in a case where the error occurrence status is not biased and is favorable, and determines a probability of the individual specified as the first factor being the causative individual and sets a determination result as the first determination result in a case where the error occurrence status is not biased and is not favorable, the second determination section determines that the individual specified as the second factor is not the causative individual and determines a probability of a specific individual of which the error occurrence status is inferior among the individuals of the determination target as the first factor being the causative individual in a case where the error occurrence status is biased, determines that the individual specified as the second factor is not the causative individual and further determines that the first factor does not include the causative individual in a case where the error occurrence status is not biased and is favorable, and determines a probability of the individual specified as the second factor being the causative individual and sets a determination result as the second determination result in a case where the error occurrence status is not biased and is not favorable, and the cause estimation section identifies the causative individual satisfying the first determination result and the second determination result in a case where the first determination result and the second determination result do not conflict with each other, and is not capable of identifying the causative individual in a case where the first determination result and the second determination result conflict with each other.

4. The component mounter according to claim 1, wherein the factor setting section sets the devices or the data related to a supply operation for the component as the first factor, and sets the devices or the data related to a pickup operation and a mounting operation for the component as the second factor.

5. The component mounter according to claim 4, wherein the factor setting section sets multiple combinations each including any of multiple first factors that are settable and any of multiple second factors that are settable, and the first determination section, the second determination section, and the cause estimation section are operated on each of a total number of the multiple combinations.

6. The component mounter according to claim 1, wherein the error occurrence status is represented by a combination of the number of times of execution of the mounting work and the number of occurrences of the mounting error.

7. The component mounter according to claim 1, wherein the first determination section and the second determination section set, as determination targets, a regulated number of the individuals having inferior error occurrence statuses with respect to each of the first factor and the second factor.

8. The component mounter according to claim 1, wherein the first determination section and the second determination section set, as the determination target, the individual of which the number of uses for the mounting work is equal to or larger than a regulated number of uses with respect to each of the first factor and the second factor.

9. The component mounter according to claim 1, wherein the first determination section and the second determination section set, as the determination target, the individual of which the number of occurrences of the mounting error is equal to or larger than a minimum number of errors with respect to each of the first factor and the second factor.

10. The component mounter according to claim 1, wherein the mounting error is detected by a component camera that captures an image of a state in which the device has picked up the component, or by a board inspection machine that is provided in a downstream process of the component mounter and inspects the mounted component.

11. The component mounter according to claim 1, wherein the device includes at least one of a reel on which a carrier tape holding the component is wound, the feeder configured to draw the carrier tape from the reel to enable supply of the component, the suction nozzle configured to pick up the component by using a negative pressure, a mounting head configured to movably hold the suction nozzle, and a component camera configured to capture an image of a component picked up by the suction nozzle, and the data includes at least one of component data that defines properties and handling conditions of the component, shape data that is a part of the component data and defines an appearance shape of the component, feeder arrangement data that defines an arrangement position of the feeder in the component mounter, and coordinate data that defines a position of the board on which the component is mounted.

12. A mounting method comprising:

mounting one component on a board by controlling a board conveyance device configured to convey a board, a feeder configured to store the components to be mounted on the board, and a component transfer device including a suction nozzle configured to pick up a component from the feeder and mount the component on the board;

estimating a cause of a mounting error comprising:

an error history storage step of processing and storing an error occurrence status of a mounting error that mounting work of mounting a component on a board has failed in a component mounter by attributing the error occurrence status into either individuals of one or more types of devices used for the mounting work or individuals of one or more types of data used for the mounting work, or both;

a factor setting step of selecting two types of factors from at least one of the devices and the data and respectively setting the selected factors as a first factor and a second factor;

a first determination step of, for each individual of a determination target, performing a process of specifying the individual as the first factor, obtaining the error occurrence status for each individual as the second factor under a condition that the individual as the first factor is specified and determining whether the obtained error occurrence status is biased according to a difference in the second factor;

a second determination step of, for each individual of the determination target, performing a process of specifying the individual as the second factor, obtaining the error occurrence status for each individual as the first factor under a condition that the individual as the second factor is specified, and determining whether the obtained error occurrence status is biased according to a difference in the first factor; and a cause estimation step of identifying a causative individual causing the mounting error based on a first determination result in the first determination step and a second determination result in the second determination step;

correcting the causative individual;

mounting another component after correcting the causative individual.

* * * * *